United States Patent

Ukita

Patent Number: 5,821,159

Date of Patent: Oct. 13, 1998

[54] THIN FILM TRANSISTOR SUBSTRATE HAVING LOW RESISTIVE AND CHEMICAL RESISTANT ELECTRODE INTERCONNECTIONS AND METHOD OF FORMING THE SAME

[75] Inventor: Tooru Ukita, Tokyo, Japan

[73] Assignee: NEC Corporation, Tokyo, Japan

[21] Appl. No.: 773,345

[22] Filed: Dec. 26, 1996

[30] Foreign Application Priority Data

Dec. 26, 1995 [JP] Japan .................................. 7-339400

[51] Int. Cl.⁶ ..................................................... H01L 21/84
[52] U.S. Cl. .......................... 438/592; 438/30; 438/158; 438/658
[58] Field of Search ............................. 438/30, 158, 592, 438/658

[56] References Cited

U.S. PATENT DOCUMENTS 5,472,889  12/1995  Kim et al. .
5,496,752  3/1996  Nasu et al. .
5,518,936  5/1996  Yamamoto et al. .
5,585,290  12/1996  Yamamoto et al. .

Primary Examiner—John Niebling
Assistant Examiner—Richard A. Booth
Attorney, Agent, or Firm—Young & Thompson

[57] ABSTRACT

A first method of forming a thin film transistor substrate having at least an electrode interconnection, wherein a first low resistive metal layer is formed, which extends on the top surface of the substrate by sputtering method. A second low resistive metal layer is formed, which is highly resistant to chemicals and extends on the top of the first low resistive metal layer by sputtering method. A photo-resist film is applied on the second low resistive metal layer for exposure and development thereof to form a photo-resist etching mask. The first and second low resistive metal layers are subjected to an isotropic etching by use of the photo-resist etching mask. A third low resistive metal layer which is highly resistant to chemicals are formed over an entire region of the substrate by sputtering method. The third low resistive metal layer is subjected to a reactive ion etching to leave the third low resistive metal layer on the opposite sides of the first low resistive metal layer. The photo-resist mask is removed so that the first low resistive metal layer is formed without being exposed to developer, resist release solution and cleaning solution.

1 Claim, 4 Drawing Sheets

THIN FILM TRANSISTOR SUBSTRATE HAVING LOW RESISTIVE AND CHEMICAL RESISTANT ELECTRODE INTERCONNECTIONS AND METHOD OF FORMING THE SAME

BACKGROUND OF THE INVENTION

The present invention relates to a thin film transistor substrate having low resistive and chemical resistant electrode interconnections and a method of forming the same.

In recent years, scaled up and high fine liquid crystal displays utilizing thin film transistors have been required. A display has been practiced which has a screen size of over 10 inches and a pixel pitch less than 0.24 mm.

FIG. 1 is a circuit diagram illustrative of a liquid crystal display utilizing thin film transistors. A plurality of gate bus interconnections 9 are provided in vertical to a plurality of source bus interconnections 16. Thin film transistors 30 serving as switching devices are provided at crossing points of the gate bus interconnections 9 and the source bus interconnections 16. If in the plural gate bus interconnections 9, a gate bus interconnection Xi is selected, then the thin film transistors 30 connected to the gate bus interconnection Xi turn ON so that voltage signals corresponding to the information about image are transmitted from the source to the drain.

The drain is connected to a pixel electrode 25. The voltage signal is then transmitted to the pixel electrode 25. The pixel electrode 25 and an opposite electrode 27 make a pair, which sandwiches a liquid crystal layer 26 to apply an electric field across the liquid crystal layer 26 so as to vary light transmission of the liquid crystal layer 26.

On the other hand, if the gate bus interconnection Xi enters into non-selected state, then the thin film transistors 30 connected to the gate bus interconnection Xi turn OFF. Subsequently, a gate bus interconnection Xj is selected, then the thin film transistors 30 connected to the gate bus interconnection Xj turn ON. After the gate has turned OFF, a voltage between the pixel electrode 25 and the opposite electrode 27 is kept by the liquid crystal layer 26 until the same gate bus interconnection is selected.

By the way, the scaling up of the fine liquid crystal display results in increase in length of the interconnection whilst reduction in width of the interconnection. As a result, the resistance of the interconnection is increased. The time delay in transmission of the signal on the interconnection is defined by a time constant given by the product of the resistance of the interconnection and the parasitic capacitance thereof. The increase in the resistance of the interconnection causes an increase of the time constant, resulting in an increase in the time delay in transmission of the signal on the interconnection. There is caused deterioration in rising up and falling down of the signal. This makes it difficult that the signals are transmitted within a predetermined time duration.

In order to settle the above problem, it is required to reduce the resistance of the interconnection. To reduce the resistance of the interconnection, it is possible to increase the thickness of the interconnection. This increase in thickness of the interconnection causes a deterioration in step coverage of interconnection layer and insulative films which overly the edge of the interconnection. As a result, there are caused disconnection of the interconnection layer at the edge of the gate interconnection layer with the increased thickness or deterioration in insulation property of the insulative film at the step.

To avoid the above problem, it is required to use a low resistive metal interconnection such as aluminum, molybdenum and tungsten interconnections. Notwithstanding, such low resistive metal has a weak acidic resistance for which reason the low resistive metal may show corrosion by etchant including a hydrochloric acid and a nitric acid to be used for forming the pixel electrode 25.

The above low resistive metal also has a weak chemical resistance so that such metal may be dissolved into various chemicals such as developer, resist release solution and cleaning solution. This results in a deterioration in property of such chemicals.

In order to solve the above problem, the following technique was proposed as disclosed in the Japanese laid-open patent publication No. 3-72319 FIG. 2 is a fragmentary plane view illustrative of a conventional transistor substrate. FIG. 3 is a fragmentary cross sectional elevation view along B—B line in FIG. 2.

As illustrated in FIG. 2, this conventional thin film transistor has a gate bus interconnection 67 which comprises a first gate bus interconnection 65 and a second gate bus interconnection 66. The second gate bus interconnection 66 is formed to cover the first gate bus interconnection 65 completely. A gate electrode 62 of the thin film transistor 39 is branched from the second gate bus interconnection 66. A pixel electrode 25 is connected via a drain electrode 64 to the thin film transistor 39.

As illustrated in FIG. 3, a gate electrode 62 is provided over a glass substrate 1 wherein the gate electrode 62 is branched from a second gate bus interconnection 66. A gate insulation film 10 made of silicon nitride is formed over an entire surface of the glass substrate 1 to cover the gate electrode 62. A semiconductor layer 11 made of amorphous silicon is formed on the gate insulation film 10 over the gate electrode 62. A contact layer 12 made of n-amorphous silicon is formed over the semiconductor layer 11. The contact layer 12 is provided to form ohmic contact between the semiconductor layer 11 and source and drain electrodes 63 and 64. The source electrode 63 is formed to be branched from the source bus interconnection 61. A pixel electrode 25 is superimposed on an edge of the drain electrode 64.

In the above prior art, the first gate bus interconnection is made of a low resistive metal. The second gate bus interconnection made of a highly acidic-resistive metal such as tantalum is formed to cover the first gate bus interconnection completely so as to prevent corrosion by etchant of the first gate bus interconnection and to reduce the gate bus electric resistance. The second gate bus interconnection protects the first gate bus interconnection from etchant and from being dissolved into chemicals in photo-lithography process.

In the above prior art, however, there is a problem that when the first gate bus interconnection 65 is formed, the low resistive metal is dissolved into the chemicals for photolithography.

The method of forming the interconnection structure in the well known photo-lithography will be described with reference to FIGS. 4A through 4D.

With reference to FIG. 4A, a metal film 38 is formed on a thin film transistor substrate 31. A photo-resist film 34 is applied on the metal film 38.

With reference to FIG. 4B, the photo-resist film 34 is subjected to an exposure and development for patterning the same into the interconnections wherein the developer is used as an etchant to the resist film 34. The developer is made into contact with a top surface of the metal film 38.

With reference to FIG. 4C, the metal film 38 is etched by use of the photo-resist film 34 as a mask to form interconnections.

With reference to FIG. 4D, the photo-resist film 34 is removed by use of a resist release solution where the resist release solution is made into contact with the top and side surfaces of the metal film 38.

Further, the cleaning process is required before entry into the following step. Namely, the metal film 38 is further made into contact with the cleaning solution.

As described above, in the photo-lithography process, three chemicals are used other than the etchant and are made into contact with the metal film 38. If in order to reduce the resistivity of the interconnection, low resistive metals such as aluminum alloy, aluminum, molybdenum and tungsten are used, then their metals are dissolved into the chemicals which are alkyl thereby deterioration in properties of the chemicals. This results n a lowering of the yield of the products.

As to forming the interconnections of the gate bus 67 illustrated in FIG. 2, a first photo-lithography process is carried out to form the first gate bus interconnection 65 and subsequently a second photo-lithography process is carried out to form the second gate bus interconnection 66. Namely, two photo-lithography processes are necessary. Different resist film masks are provided for two times exposures and developments, resulting in lowering the yield and increase in the manufacturing cost. This also makes it difficult to form fine liquid crystal display.

The resistance of the source bus interconnection 61 is not reduced. If the screen size is over 13 inches, not only a delay of gate signal but also deterioration of source signal are not ignore, for which reason it is required to reduce the resistance of the source bus interconnection.

In order to solve the above problem, there was proposed a technique using aluminum as a low resistive metal which is disclosed in the Japanese laid-open patent publication No. 4-240824.

In this technique, a simple photo-lithography process is carried out to form a chemical resistive film which covers the top and side faces of the low resistive electrode interconnection. FIG. 5 is a fragmentary cross sectional elevation view illustrative of the conventional thin film transistor.

As illustrated in FIG. 5, a first gate electrode film 3 made of aluminum is formed on a glass substrate 1. A gate electrode film 4 comprising a metal film made of at least one selected from the group consisting of tantalum, niobium, tungsten, molybdenum and alloys thereof is deposited for subsequent patterning of the first gate film 3 and the second gate film 4 to form interconnections. In a pure water at a temperature in the range of 70° –100° C., a heat treatment is carried out to form a third gate electrode film 5 made of aluminum oxide only on side faces of the first gate electrode film 3 to thereby form a gate electrode 2.

In the above prior art, if the second gate electrode film 4 is made of tantalum, then tantalum and aluminum oxide films with sufficient chemical resistance cover the top and side faces of the first gate electrode film 3 made of low resistive metal, for example, aluminum to prevent the first gate electrode film 3 from corrosion by etchant and from being dissolved into chemicals to be used in the photo-lithography process.

However, when the second gate electrode 4 and the first gate electrode 3 are patterned to form the interconnections by the photo-lithography, the aluminum may be dissolved into the chemicals to be used in the photo-lithography whereby the property of the chemicals are deteriorated.

Also this technique can not be applied in forming the source bus interconnection 16 and the source electrode 20.

Notwithstanding, the first source bus interconnection 13 and the first source electrode 17, both of which are made of aluminum, are covered by the second source bus interconnection 17 and the second source electrode film 18, both of which are made of metal highly resistive to chemicals. Also the first drain electrode film 21 made of aluminum is covered by the second drain electrode film 22 made of the metal highly resistive to chemicals. The top of the semiconductor layer 11 is covered by a channel protection film 28.

However, in the above structure of the liquid crystal display, the side faces of the aluminum film are shown and may be made contact into the chemicals for which reason the aluminum is dissolved into the chemicals.

If the pixel electrode 29 is made of a tin-added indium oxide, then the pixel electrode 29 and the first drain electrode 21 comprising the aluminum film are exposed to the alkyl resist release solution and cleaning solution in the photo-lithography process, then a local battery system via an electrolytic solution between the aluminum and tin-added indium oxide, resulting in a corrosion of the aluminum film.

There was proposed a technique that a chemical resistant metal film covers the interconnections, which is disclosed in the Japanese laid-open patent publication No. 1-94664. The tungsten interconnection is coated by the tungsten nitride film as illustrated in FIG. 6.

Over a silicon substrate 41, a gate insulation film 43 is provided which extends across source and drain regions 47 and 48. A potential barrier layer 44 made of tungsten nitride and having a thickness of 50 nanometers is formed over the gate insulation film 43. A tungsten layer 45 having a thickness of 400 nanometers is laminated over the potential barrier layer 44. Further, a tungsten nitride layer 46 having a thickness of 50 nanometers is provided to cover the top and side faces of the tungsten layer 45 to thereby form the gate electrode.

In the above technique, a refractory metal nitride layer with a low reactivity to silicon atom is provided to coat the refractory metal layer forming the gate electrode in order to prevent deterioration in withstand voltage caused by the reaction of the gate electrode or the inter-layer insulator to the gate electrode and the refractory metal layer and also prevent variation in threshold voltage of the transistor.

In the above prior art technique, the tungsten nitride films 44 and 46 highly resistive to the chemicals are provided to coat entirely the gate electrode. If this structure is applied to the thin film transistor, then it is possible to suppress the low resistive metal from being dissolved into the chemicals in the photo-lithography and from the corrosion of the electrode by the etchant.

In the above prior art, however, the tungsten layer may be dissolved into the chemicals in the photo-lithography whereby the priority of the chemicals is deteriorated. The tungsten layer 45 and the tungsten nitride layer 46 are formed by two times of the photo-lithography processes, whereby the number of processes is increased and it is difficult to form fine elements.

Further, the above technique has a problem that the silicon oxide film as the gate Insulation film 43 is not adhesive to the tungsten nitride film 44.

In the foregoing prior art, the low resistive and poor chemical resistant metal layers are exposed to chemicals used for photo-lithography in forming the rich chemical resistant metal layers which cover the low resistive and poor chemical resistant metal layers and may be dissolved into the chemicals, even the low resistive and poor chemical resistant metal layers will completely be coated by the rich chemical resistant metal layers, for which reason the properties of the chemicals are deteriorated.

In order to form the chemical resistant interconnections which cover the low resistive poor chemical resistant interconnections, two time photo-lithography processes are required to be carried out. This results in increase in the number of processes and makes it difficult to form the fine elements.

SUMMARY OF THE INVENTION

Accordingly, it is an object of the present invention to provide a novel thin film transistor substrate having electrode interconnection structures which are chemical resistant for preventing deterioration in properties of the chemicals used in the photo-lithography processes.

It is a further object of the present invention to provide a novel method of forming a thin film transistor substrate having electrode interconnection structures which are chemical resistant for preventing deterioration in properties of the chemicals used in a single photo-lithography process.

The above and other objects, features and advantages of the present invention will be apparent from the following descriptions.

The present invention provides a thin film transistor substrate having at least an electrode interconnection which comprises a first low resistive metal layer which extends on the top surface of the substrate, a second low resistive metal layer which is highly resistant to chemicals and extends on the top of the first low resistive metal layer, and third low resistive metal layers which are highly resistant to chemicals and extend on the opposite sides of the first low resistive metal layer so that the first low resistive metal layer is completely covered by the second and third low resistive metal layers. The electrode interconnection is covered by an insulation film formed over the substrate.

The first low resistive metal layer is made of a metal selected from the group consisting of tungsten, molybdenum, aluminum, and an aluminum alloy whilst the second and third low resistive metal layers are made of a metal selected from the group consisting of tantalum, tantalum alloys, tungsten nitride, and chromium.

Alternatively, the first low resistive metal layer is made of tungsten, the second low resistive metal layer is made of a metal selected from the group consisting of tantalum, tantalum alloys, tungsten nitride, and chromium, and the third low resistive metal layer is made of tungsten nitride.

Since tantalum, tantalum alloys, tungsten nitride, and chromium have smaller solubility to the chemicals by $1 \times 10^{-1}$ to $1 \times 10-4$ than other low resistive metals such as tungsten.

The present invention provides a first method of forming a thin film transistor substrate having at least an electrode interconnection as follows. A first low resistive metal layer is formed, which extends on the top surface of the substrate by sputtering method. A second low resistive metal layer is formed, which is highly resistant to chemicals and extends on the top of the first low resistive metal layer by sputtering method. A photo-resist film is applied on the second low resistive metal layer for exposure and development thereof to form a photo-resist etching mask. The first and second low resistive metal layers are subjected to an isotropic etching by use of the photo-resist etching mask. A third low resistive metal layer which is highly resistant to chemicals are formed over an entire region of the substrate by sputtering method. The third low resistive metal layer is subjected to a reactive ion etching to leave the third low resistive metal layer on the opposite sides of the first low resistive metal layer. The photo-resist mask is removed so that the first low resistive metal layer is formed without being exposed to developer, resist release solution and cleaning solution.

The first low resistive metal layer is made of a metal selected from the group consisting of tungsten, molybdenum, aluminum, and an aluminum alloy whilst the second and third low resistive metal layers are made of a metal selected from the group consisting of tantalum, tantalum alloys, tungsten nitride, and chromium.

The present invention provides a second method of forming a thin film transistor substrate having at least an electrode interconnection as follows. A first low resistive metal layer made of tungsten is formed by sputtering method, which extends on the top surface of the substrate. A second low resistive metal layer made of a metal selected from the group consisting of tantalum, tantalum alloys, tungsten nitride, and chromium is formed by sputtering method, which is highly resistant to chemicals and extends on the top of the first low resistive metal layer. A photo-resist film is applied on the second low resistive metal layer for exposure and development thereof to form a photo-resist etching mask. The first and second low resistive metal layers are subjected to an isotropic etching by use of the photo-resist etching mask. The opposite sides of the first low resistive metal layer are subjected to a plasma discharge treatment in any one of nitrogen gas and ammonia gas to make tungsten into tungsten nitride at the opposite sides of the first low resistive layer so as to form a third low resistive tungsten nitride layer which is highly resistant to chemicals. The photo-resist mask is removed so that the first low resistive metal layer is formed without being exposed to developer, resist release solution and cleaning solution.

The present invention provides a third method of forming a thin film transistor substrate having at least an electrode interconnection as follows. A first low resistive metal layer made of tungsten is formed by sputtering method, which extends on the top surface of the substrate. A second low resistive metal layer made of a metal selected from the group consisting of tantalum, tantalum alloys, tungsten nitride, and chromium is formed by sputtering method, which is highly resistant to chemicals and extends on the top of the first low resistive metal layer. A photo-resist film is applied on the second low resistive metal layer for exposure and development thereof to form a photo-resist etching mask. The first and second low resistive metal layers are subjected to a reactive ion-etching in a mixing gas including nitrogen to etch the first and second metal films as well as make tungsten into tungsten nitride at the opposite sides of the first low resistive layer so as to form a third low resistive tungsten nitride layer which is highly resistant to chemicals. The photo-resist mask is removed so that the first low resistive metal layer is formed without being exposed to developer, resist release solution and cleaning solution.

In the exposure and development of the photo-resist film, the first low resistive layer is completely coated by the second low resistive layer which is highly resistant to the chemical, for example, developer. The first low resistive layer is completely isolated by the second low resistive layer from the chemical.

In the removal of the photo-resist mask and cleaning process, the top and opposite sides of the first low resistive layer are coated by the second and third low resistive layers which are highly resistant to the chemicals. The first low resistive layer is thus completely isolated by the second and highly low resistive layers from the chemicals.

In the first method according to the present invention, a combination of isotropic and anisotropic etching processes are used to form the above interconnection structure by a single photo-lithography.

In the second and third methods according to the present invention, the plasma nitration is used to form the above interconnection structure by a single photo-lithography.

BRIEF DESCRIPTIONS OF THE DRAWINGS

Preferred embodiments according to the present invention will be described in detail with reference to the accompanying drawings.

PREFERRED EMBODIMENTS

Figure 1:
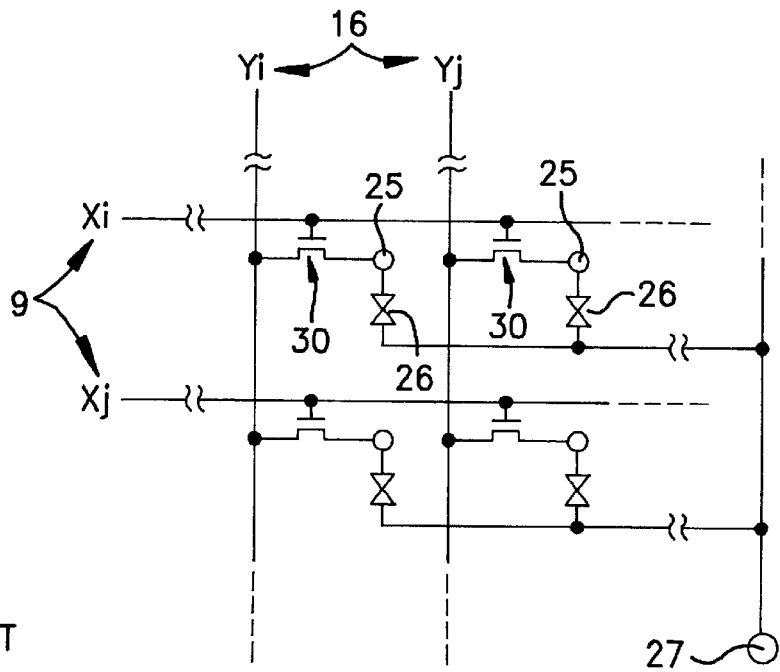
FIG. 1 is a circuit diagram illustrative of a thin film transistor liquid crystal display.
Figure 2:
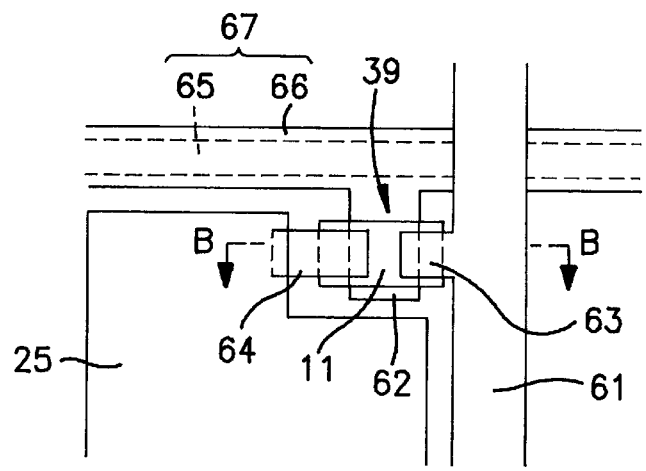
FIG. 2 is a fragmentary plane view illustrative of a conventional thin film transistor having an electrode interconnection.
Figure 3:
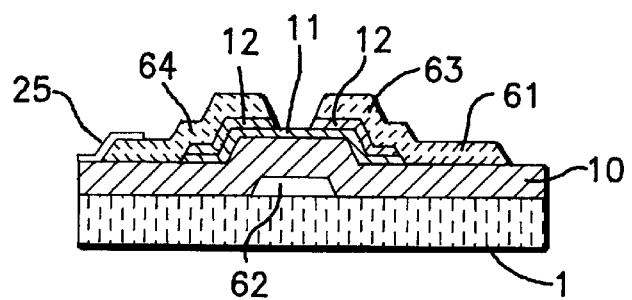
FIG. 3 is a fragmentary cross sectional elevation view illustrative of a conventional thin film transistor illustrated in FIG. 2.
Figure 4A:
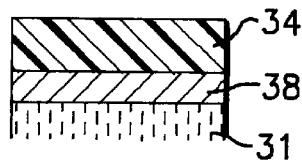
FIGS. 4A through 4D are fragmentary cross sectional elevation views illustrative of a method of forming an electrode interconnection extending on a thin film transistor substrate.
Figure 4B:
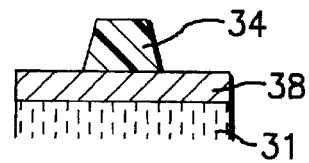
Figure 4C:
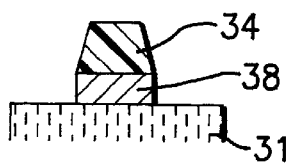
Figure 4D:
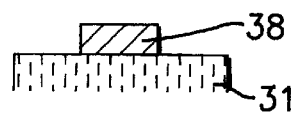
Figure 5:
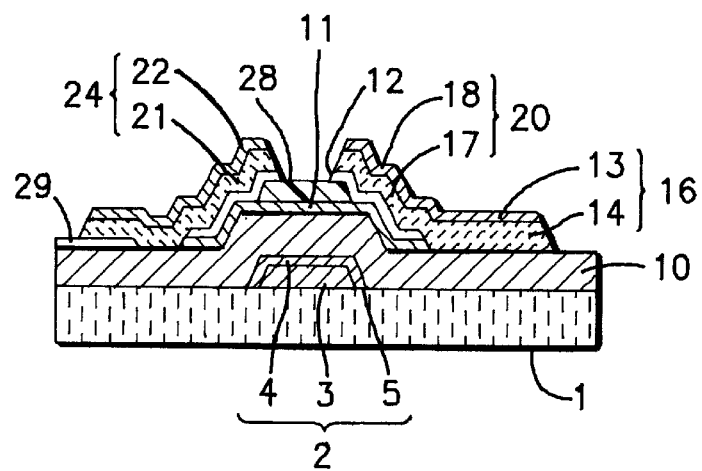
FIG. 5 is a fragmentary cross sectional elevation view illustrative of another conventional thin film transistor having an electrode interconnection.
Figure 6:
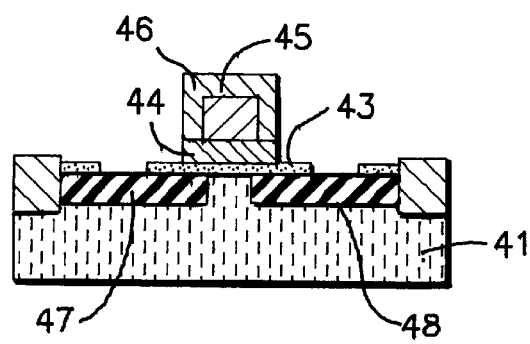
FIG. 6 is a fragmentary cross sectional elevation view illustrative of still another conventional thin film transistor having an electrode interconnection.
Figure 7:
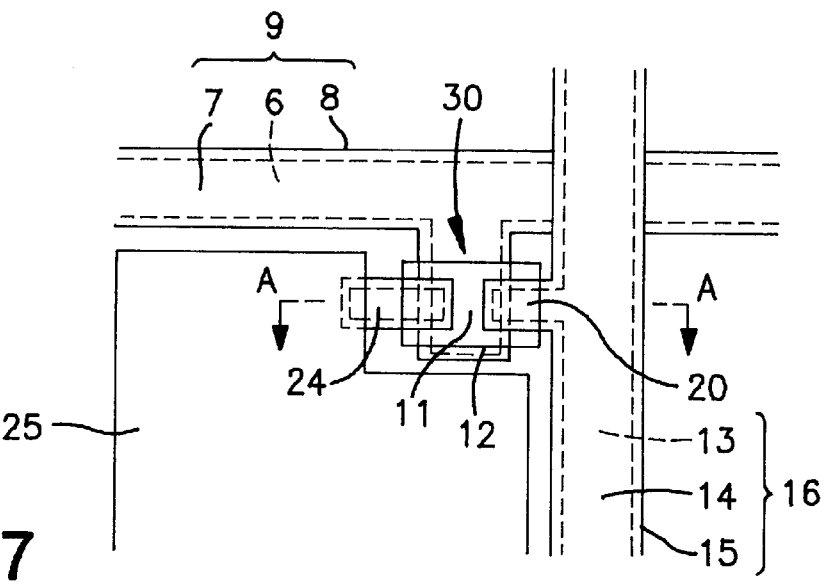
FIG. 7 is a fragmentary plane view illustrative of a novel thin film transistor having an electrode interconnection in a first embodiment according to the present invention.
Figure 8:
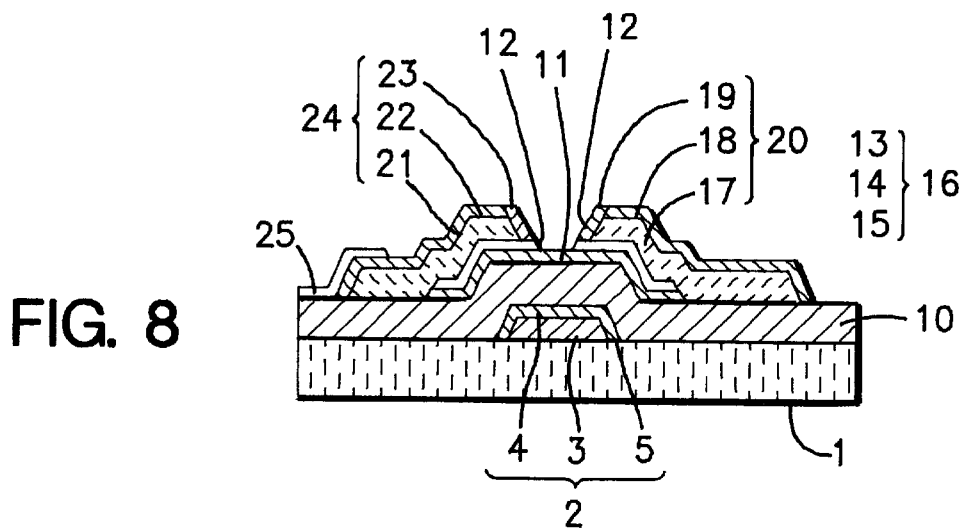
FIG. 8 is a fragmentary cross sectional elevation view illustrative of a novel thin film transistor having an electrode interconnection illustrated in FIG. 7.

A first embodiment according to the present invention will be described in detail with reference to FIGS. 7 and 8. A gate bus interconnection 9 and a gate electrode 2 are simultaneously formed over the glass substrate 1. The gate bus interconnection 9 comprises a first gate bus interconnection 6, a second gate bus interconnection 7 and third gate bus interconnections 8. The second gate bus interconnection 7 is formed to cover the top of the first gate bus interconnection 6. The third gate bus interconnections 8 are formed to cover the opposite sides of the first gate bus interconnection 6. In a thin film transistor 30, a gate electrode 2 is provided which comprises first, second and third gate electrode films 3, 4 and 5 which are branched from the gate bus interconnection 9. The second gate electrode film 4 is formed to cover the top of the first gate electrode film 4. The third gate electrode films 5 are formed to cover the opposite sides of the first gate electrode film 4.

A gate insulation film 10 made of silicon nitride is formed over an entire surface of the substrate 1 to cover the gate electrode 2. A semiconductor layer 11 made of amorphous silicon is formed on the gate insulation film 10. A contact layer 12 made of n-amorphous silicon is formed on the semiconductor layer 11. The semiconductor layer 11 and the contact layer 12 are selectively etched in a predetermined pattern to form islands thereof.

Subsequently, a source bus interconnection 16, a source electrode 20 and a drain electrode 24 are simultaneously formed over the substrate 1. The source bus interconnection 6 comprises a first source bus interconnection 13, a second source bus interconnection 14 and a third source bus interconnection 15. The second source bus interconnection 13 is formed to cover the top of the first source bus interconnection 13. The third source bus interconnections 16 are formed to cover opposite sides of the first source bus interconnection 13.

A source electrode 20 is formed to be branched from the source bus interconnections 16. The source electrode 20 comprises a first source electrode film 17, a second source electrode film 18 and third source electrode films 19. The second source electrode film 18 is formed to cover the top of the first source electrode film 16. The third source electrode films 19 are formed to over the opposite sides of the first source electrode film 16.

A drain electrode 24 comprises a first drain electrode film 21, a second drain electrode film 22 and third drain electrode films 23. The second drain electrode film 22 is formed to cover the top of the first drain electrode film 21. The third drain electrode films 23 are formed to over opposite sides of the first drain electrode film 21.

The contact layer 12 is etched by use of the source and drain electrodes 20 and 24 as masks to divide the contact layer 12 into a source electrode side portion and a drain electrode side portion.

A pixel electrode 25 is formed which is connected via the drain electrode 24 to the thin film transistor 30.

A method of forming the electrode interconnection over the substrate will be described with reference to FIGS. 9A through 9F.

Figure 9A:
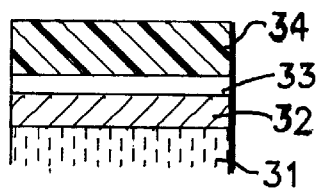
FIGS. 9A through 9F are fragmentary cross sectional elevation views illustrative of a method of forming a novel thin film transistor having an electrode interconnection in a first embodiment according to the present invention.

With reference to FIG. 9A, a low resistive tungsten film 32 is deposited over a thin film transistor substrate 31 by a DC sputtering method or an RF sputtering method. A chemical resistant tantalum film 33 is then deposited on the low resistive tungsten film 32 by the DC sputtering method or the RF sputtering method. A photo-resist film 34 is applied on the chemical resistant tantalum film 33 by spin coating method.

Figure 9B:
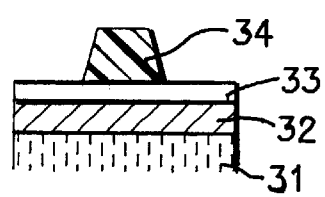

With reference to FIG. 9B, the photo-resist film 34 is exposed and developed in a predetermined pattern to form interconnection pattern masks.

At this time, an alkyl developer is used as an etchant to the photo-resist film 34. Since the tungsten film 32 with a poor chemical resistance is covered by the tantalum film 33 resistant to the etchant, the tungsten film 32 is completely isolated by the tantalum film 33 from the chemical or the developer as the etchant whereby the tungsten film 32 is prevented from being dissolved into the developer.

Figure 9C:
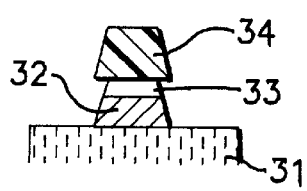

With reference to FIG. 9C, the tantalum film 33 and the tungsten film 32 are simultaneously subjected to an isotropic etching, for example, a plasma etching by use of tetrafluorocarbon and oxygen as reactive gases and use of the photo-resist pattern as masks to form interconnection patterns of the laminations of the remaining tantalum and tungsten films 33 and 32.

Figure 9D:
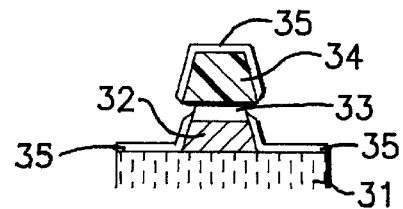

With reference to FIG. 9D, a tantalum film 35 is entirely deposited over the substrate by a DC sputtering method or an RF sputtering method whereby opposite sides of the patterned tungsten film 32 are coated by the tantalum film 35.

Figure 9E:
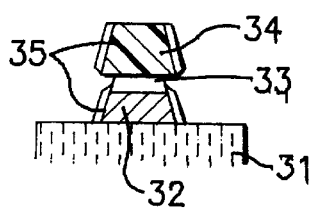

With reference to FIG. 9E, the tantalum film 35 is subjected to an anisotropic etching, for example, a reactive ion-etching by the activated ions and by use of the tetrafluoro-carbon and oxygen so that the tantalum film 35 remains on opposite sides of each of the tungsten film 32 and the tantalum film 35.

Figure 9F:
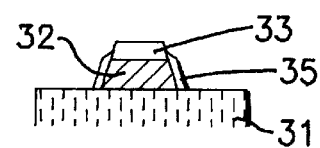

With reference to FIG. 9F, the resist film 34 is removed by use of the neutral resist release solution as an etchant to the resist film 34. If the neutral resist release solution is exposed to atmosphere, then the neutral resist release solution absorbs moisture and comes alkyl solution, for which reason if the low resistive metal film such as tungsten film is made into contact with the alkyl solution, then metal or tungsten is dissolved into the alkyl solution. In accordance with the present invention, however, the tungsten film 32 is completely isolated by the tantalum films 33 and 35 from the alkyl solution as the resist release solution so that the tungsten film 32 is prevented from being dissolved into the alkyl solution as the resist release solution.

As described above, the first bus interconnection made of a low resistive metal such as tungsten but not resistant to chemicals are coated on it stop by the second bus interconnection made of a chemical resistant metal and on its opposite sides by the third bus interconnection also made of a chemical resistant metal so that the first bus interconnection layer of the low resistive metal but not resistant to the chemicals are isolated by the second and third bus interconnection layers from the chemicals such as developer, resist release solution and cleaning solution. The above electrode interconnection structure may be formed by a single photo-lithography process.

The solubility of the tantalum film 33 is much smaller by $1 \times 10^{-3}$ than the solubility of the tungsten film 32. This demonstrates that the deterioration of the chemicals by dissolution of the metal into the chemicals are suppressed. This makes it possible to form highly reliable and excellent thin film transistor at a high yield, The reduction of the dissolution of the metal into the chemicals allows recycle of the chemicals, resulting in a reduction of the manufacturing cost of the thin film transistor.

The above method of forming the electrode interconnection structure over the substrate requires a single photo-lithography process, resulting in a reductions in manufacturing cost and time of the thin film transistor whilst increase in the yield of the products of the thin film transistor. It is possible to reduce an error on alignment in the exposure and development thereby facilitating to form the fine thin film transistor.

In place of tungsten, other low resistive metals such as molybdenum, aluminum, aluminum alloys, and molybdenum/tungsten alloy are available as a metal of the first metal layer. Also in place of tantalum, other metals resistant to chemicals such as tantalum alloy, tungsten nitride and chromium are available as a metal of the second and third metal layers since those metals have smaller solubility to the chemicals. It is possible that the second and third metals are either the same or different.

A second method of forming a thin film transistor in accordance with the present invention will be described with reference to FIGS. 10A through 10E.

Figure 10A:
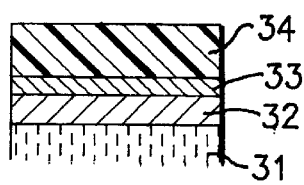
FIGS. 10A through 10E are fragmentary cross sectional elevation views illustrative of a method of forming a novel thin film transistor having an electrode interconnection in a second embodiment according to the present invention.

With reference to FIG. 10A, a low resistive tungsten film 32 is deposited on a thin film transistor substrate 31 by a DC sputtering method or an RF sputtering method. A tungsten nitride film 36 is formed on the low resistive tungsten film 32 by a reactive sputtering method using nitrogen or ammonium. A photo-resist film 34 is applied on the tungsten nitride film 36 by a spin coating method.

Figure 10B:
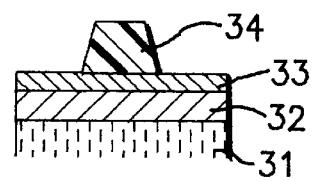

With reference to FIG. 10B, the photo-resist film is subjected to an exposure and development in a predetermined pattern to form an interconnection pattern mask wherein an alkyl developer is used as an etchant to the photo-resist film 34. The tungsten film 32 is coated by the tungsten nitride film 36 so that the tungsten film 32 is isolated by the tungsten nitride film 36 from the alkyl etchant so as to prevent the tungsten film 32 from being dissolved into the alkyl developer.

Figure 10C:
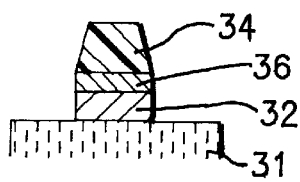

With reference to FIG. 10C, the tungsten nitride film 36 and the tungsten film 32 are subjected to a plasma etching or a reactive ion-etching by use of carbon tetrafluoride and oxygen.

Figure 10D:
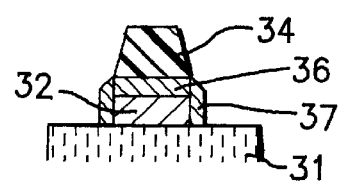

With reference to FIG. 10D, opposite sides of the tungsten film 32 are exposed to a plasma treatment in nitrogen and anmonia gases to make tungsten into tungsten nitride on the opposite sides of the tungsten film 32. As a result, the top of the tungsten film 32 is coated by the tungsten nitride film 36 whilst the opposite sides of the tungsten film 32 are coated by the tungsten nitride films 37. Namely, the tungsten film 32 is completely coated by the tungsten nitride films 36 and 37.

Figure 10E:
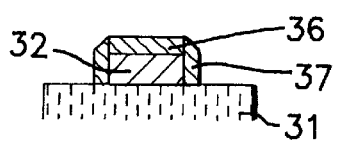

With reference to FIG. 10E, the resist film 34 is removed by use of the neutral resist release solution as an etchant to the resist film 34. The tungsten film 32 is completely isolated by the tantalum films 33 and 35 from the alkyl solution as the resist release solution so that the tungsten film 32 is prevented from being dissolved into the alkyl solution as the resist release solution.

As a modification of the above second method of forming the thin film transistor substrate in accordance with the present invention, in place of the reactive ion etching by use of carbon tetrafluoride and oxygen as reaction gases, a reactive ion etching may be available by use of a mixing gas of sulfur hexafluoride and nitride so as to etch the tungsten film and the tungsten nitride film and simultaneously make tungsten into tungsten nitride on opposite sides of the tungsten film.

As described above, in accordance with the third method of forming the thin film transistor, the first bus interconnection is made of tungsten and the second and third bus interconnections are made of tungsten nitride which is resistant to chemicals. The top of the first bus interconnection is coated by the second bus interconnection whilst the opposite sides of the first bus interconnection is coated by the third bus interconnections so as to prevent the tungsten film from being exposed to the chemicals such as the developer, the resist release solution and cleaning solution.

The solubility of tungsten nitride into the chemicals such as the developer, the resist release solution and cleaning solution is much smaller by $1 \times 10^{-1}$ than the solubility of tungsten into the chemicals, for which reason it is possible to prevent dissolution of the metal into the chemicals.

In the exposure and development of the photo-resist film, the first low resistive layer is completely coated by the second low resistive layer which is highly resistant to the chemical, for example, developer. The first low resistive layer is completely isolated by the second low resistive layer from the chemical.

In the removal of the photo-resist mask and cleaning process, the top and opposite sides of the first low resistive layer are coated by the second and third low resistive layers which are highly resistant to the chemicals. The first low resistive layer is thus completely isolated by the second and highly low resistive layers from the chemicals.

In the first method according to the present invention, a combination of isotropic and anisotropic etching processes are used to form the above interconnection structure by a single photo-lithography.

In the second and third methods according to the present invention, the plasma nitration is used to form the above interconnection structure by a single photo-lithography.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of forming a thin film transistor substrate having at least an electrode interconnection, said method comprising:

forming a first low resistive metal layer made of tungsten, which extends on the top surface of the substrate;

forming a second low resistive metal layer made of a metal selected from the group consisting of tantalum, tantalum alloys, tungsten nitride, and chromium, which is highly resistant to chemicals and extends on the top of the first low resistive metal layer;

applying a photo-resist film on the second low resistive metal layer for exposure and development thereof by use of a developer to form a photo-resist etching mask;

subjecting the first and second low resistive metal layers to an isotropic etching by use of the photo-resist etching mask;

subjecting the opposite sides of the first low resistive metal layer to a plasma discharge treatment in any one of nitrogen gas and ammonia gas to make tungsten into tungsten nitride at the opposite sides of the first low resistive layer so as to form a third low resistive tungsten nitride layer which is highly resistant to chemicals; and removal of the photo-resist mask by use of resist release solution and cleaning solution so that the first low resistive metal layer is formed without being exposed to the developer, the resist release solution and the cleaning solution.

\* \* \* \* \*